United States Patent [19]
Lai

[11] Patent Number: 6,103,619
[45] Date of Patent: Aug. 15, 2000

[54] METHOD OF FORMING A DUAL DAMASCENE STRUCTURE ON A SEMICONDUCTOR WAFER

[75] Inventor: Yeong-Chih Lai, Nan-Tow Hsien, Taiwan

[73] Assignee: United Microelectronics Corp., Hsin-chu, Taiwan

[21] Appl. No.: 09/414,895

[22] Filed: Oct. 8, 1999

[51] Int. Cl.⁷ ............... H01L 21/4763; H01L 21/311; H01L 21/302; H01L 21/461
[52] U.S. Cl. ............ 438/638; 438/622; 438/624; 438/634; 438/700; 438/735; 438/737; 438/738; 438/739; 438/740; 438/749
[58] Field of Search ..................... 438/735, 736, 438/738, 740, 638, 637, 624, 751, 749, 745, 622, 631, 633, 691, 700

[56] References Cited

U.S. PATENT DOCUMENTS

| | | | |
|---|---|---|---|
| 5,635,423 | 6/1997 | Huang et al. | 438/638 |
| 5,880,004 | 3/1999 | Ho | 438/421 |

*Primary Examiner*—Charles Bowers
*Assistant Examiner*—Thanhha Pham
*Attorney, Agent, or Firm*—Winston Hsu

[57] ABSTRACT

The present invention provides a method of forming a dual damascene structure on a semiconductor wafer. The semiconductor wafer comprises a substrate, and a first silicon oxide layer, a silicon nitride layer, a second silicon oxide layer and a photoresist layer sequentially formed on the substrate. A dry-etching process is performed first to vertically remove a specific portion of the second silicon oxide layer down to the silicon nitride layer so as to form a hole. Then the photoresist layer is removed and the portion of the silicon nitride layer positioned under the hole is removed using a phosphoric acid solution. A lithographic process is then performed to form a photoresist layer on the second silicon oxide layer, the photoresist layer comprising a line-shaped opening positioned above the hole with a width larger than the diameter of the hole. Then an etching process is performed along the line-shaped opening to vertically remove the second silicon oxide layer and the first silicon oxide layer. The photoresist layer is then removed completely. Finally, a metallic layer is deposited and a CMP process is performed to form a conductive wire coupled with the via plug on the semiconductor wafer.

10 Claims, 7 Drawing Sheets

METHOD OF FORMING A DUAL DAMASCENE STRUCTURE ON A SEMICONDUCTOR WAFER

BACKGROUND OF THE INVENTION

1. Field of the Invention

The present invention relates to a method of forming a dual damascene structure on a semiconductor wafer, and more particularly, to a method of forming a dual damascene structure with no voids inside it on a semiconductor wafer.

2. Description of the Prior Art

A dual damascene process is a method of forming a conductive wire coupled with a via plug. The dual damascene structure is used to connect devices and wires in a semiconductor wafer and is insulated with other devices by the inter-layer dielectrics (ILD) around it. At the end of the dual damascene process, a chemical mechanical polish (CMP) process is always performed to planarize the surface of the semiconductor wafer so that the subsequent deposition and photolithographic processes perform well on the wafer and so that good multilevel interconnects can be formed. As a result, the dual damascene structure is widely applied in the manufacturing process of integrated circuits. As integrated circuit technology advances, improving the yield of the dual damascene structure is an important issue in the manufacturing process of integrated circuits at the present time.

Figure 1:
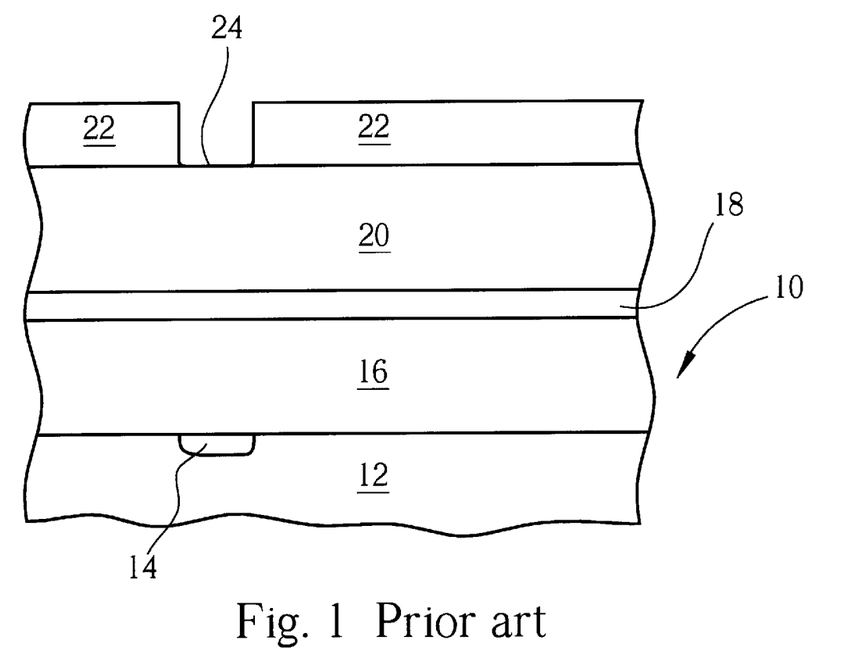
FIG. 1 to FIG. 6 are schematic diagrams of the process of forming a dual damascene structure on a semiconductor wafer according to the prior art.

Please refer to FIG. 1 to FIG. 6. FIG. 1 to FIG. 6 are schematic diagrams of the process of forming a dual damascene structure 42 on a semiconductor wafer 10 according to the prior art. As shown in FIG. 1, the semiconductor wafer 10 comprises a substrate 12, a conductive layer 14 positioned on a predetermined area of the substrate 12, a first inter layer dielectric (ILD) 16 formed of silicon oxide and positioned on the substrate 12 and the conductive layer 14, a silicon nitride (SiN) layer 18 positioned on the ILD 16, and a second inter layer dielectric (ILD) 20 formed of silicon oxide and positioned on the silicon nitride layer 18. The ILD 16, the silicon nitride layer 18 and the ILD 20 are deposited serially using a plasma-enhanced chemical vapor deposition (PECVD) process.

Figure 2:
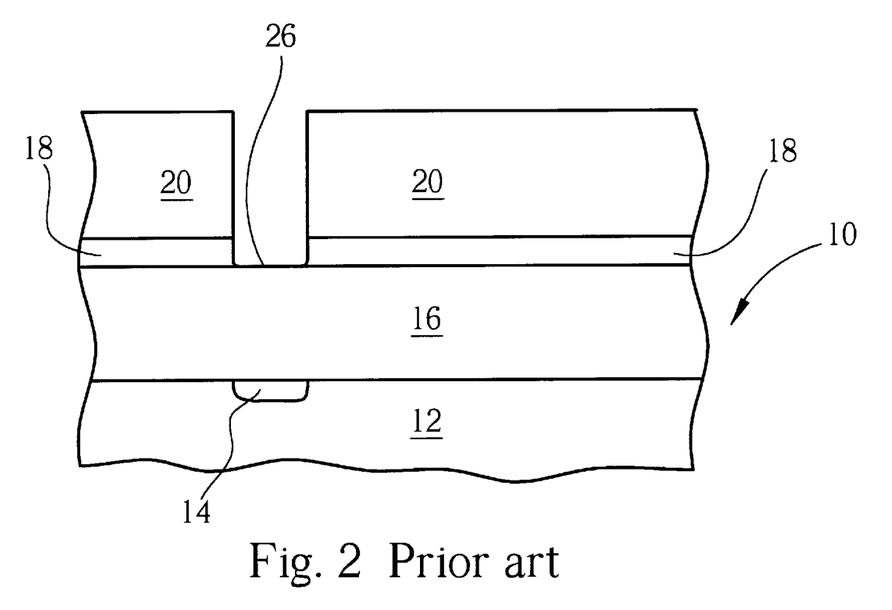

In the prior art method of forming the dual damascene structure 42, a lithographic process is performed first to form a photoresist layer 22 evenly on the ILD 20 with an opening 24 positioned above the conductive layer 14, which extends down to the ILD 20. The opening 24 is used to define the via pattern. As shown in FIG. 2, an anisotropic dry-etching process is then performed along the opening 24 to vertically remove the ILD 20 and the silicon nitride layer 18 positioned under the opening 24 down to the ILD 16 which forms a hole 26. Then a resist stripping process is performed to completely remove the first photoresist layer 22.

Figure 3:
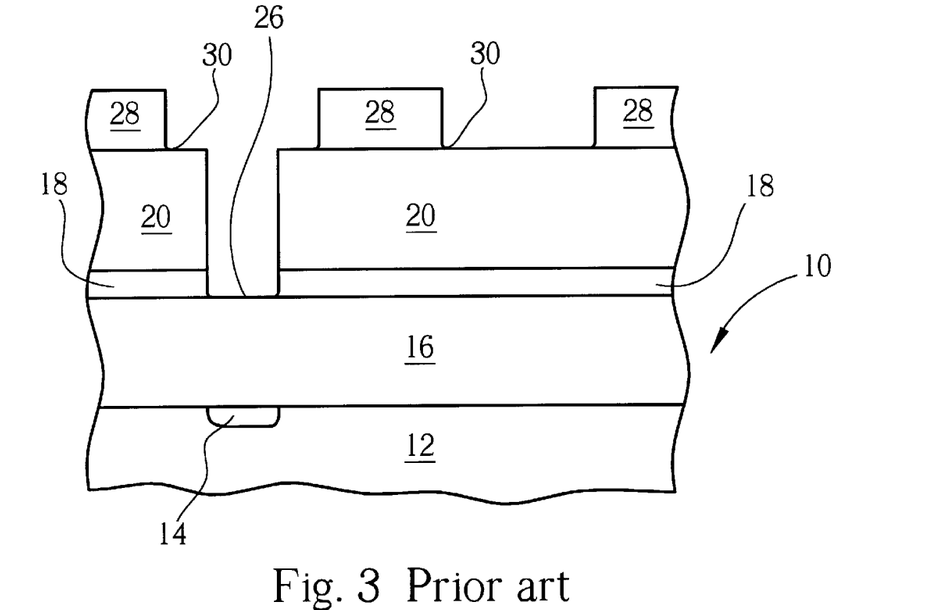
Figure 4:
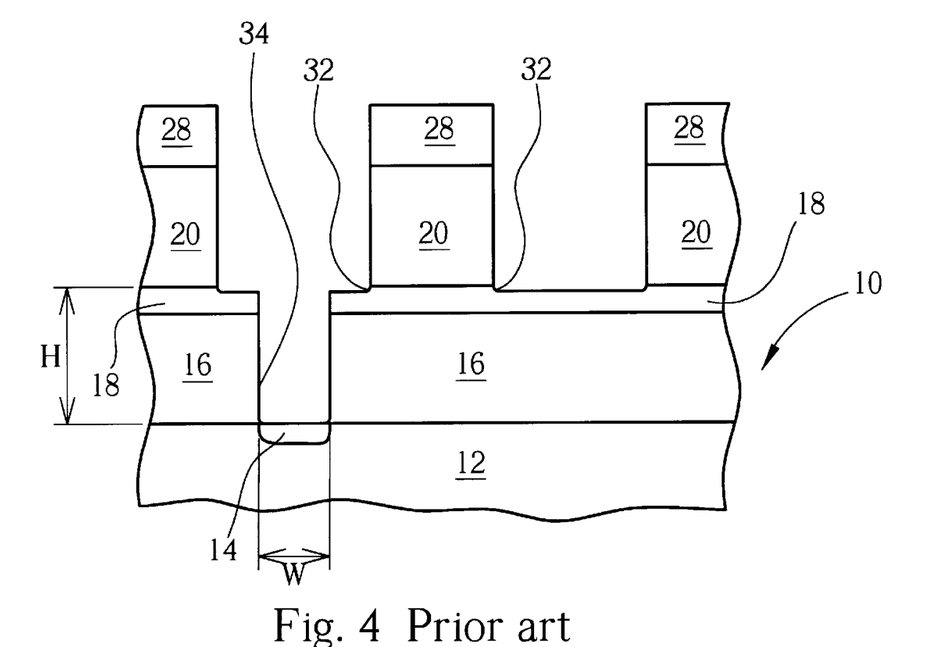

As shown in FIG. 3, a lithographic process is performed again to form a photoresist layer 28 evenly on the ILD 20 with two line-shaped openings 30 in the photoresist layer 28 to define the wiring line pattern for connecting transistors. As shown in FIG. 4, a dry-etching process is then performed along the line-shaped openings 30 and hole 26 to vertically remove the ILD 20 and ILD 16 positioned under the openings 30 and the hole 26 down to the silicon nitride layer 18 and the substrate 12 so as to form two line-shaped recesses 32 and a via hole 34 respectively.

Figure 5:
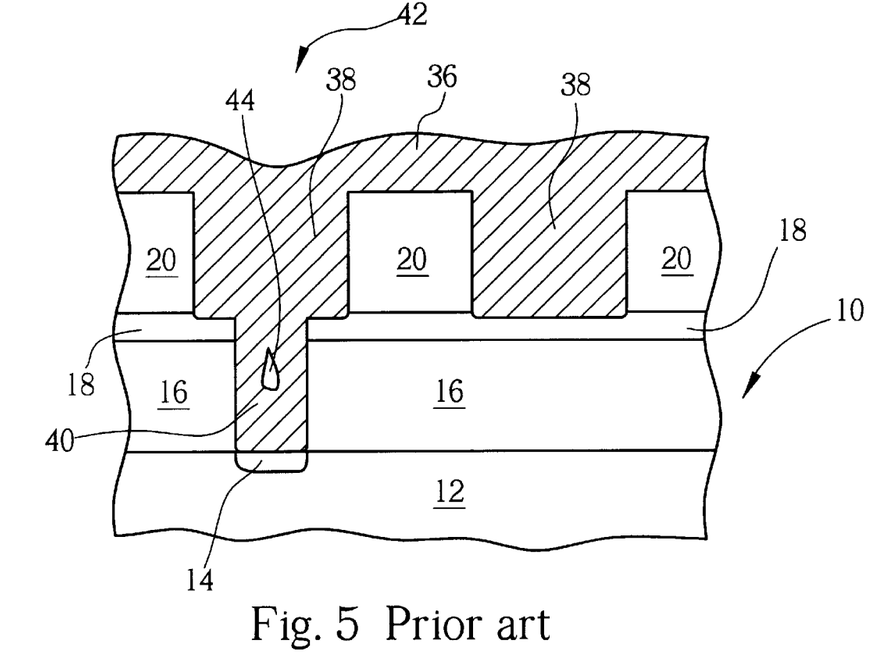
Figure 6:
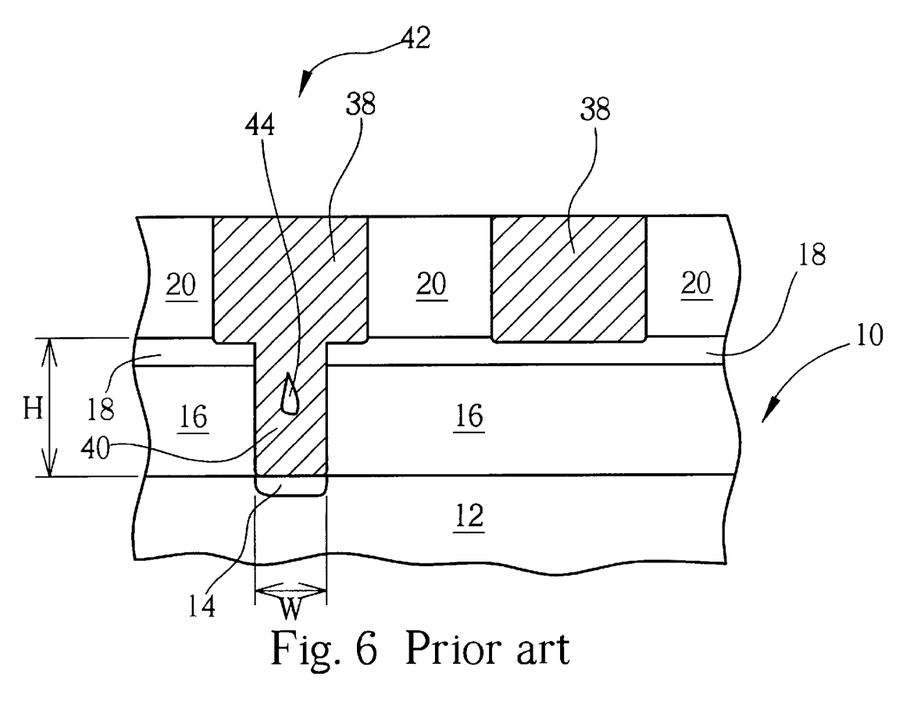

As shown in FIG. 5, the photoresist layer 28 is then removed completely. A metallic layer 36 is then deposited on the semiconductor wafer 10 to fill the line-shaped recesses 32 and the via hole 34 so as to form conductive wires 38 and a via plug 40. As shown in FIG. 6, a chemical mechanical polish (CMP) process is employed to remove the metallic layer 36 positioned on the ILD 20 and to align the upper surface of the conductive wire 38 with the surface of the ILD 20, completing the dual damascene structure 42.

In the prior art method of forming the dual damascene structure 42, the width (W) at the bottom of the via hole 34 is much smaller than its height (H), so the via hole 34 has a higher high aspect ratio. When the via hole 34 is filled with the metallic layer 36, the metallic layer 36 will overhang from the upper corners of the via hole 34 and further restrict the hole 34, causing voids 44 to form inside it. The resistance of the via plug 40 will increase because of the voids 44 in the via plug 40, resulting in an unstable electrical current in the dual damascene structure 42 which can effect the electrical performance of the entire semiconductor integrated circuit. Furthermore, because of the voids 44 inside the via plug 40, the structure of the dual damascene may be weakened and so more easily destroyed in subsequent processes.

SUMMARY OF THE INVENTION

It is therefore a primary objective of the present invention to provide a method of forming a dual damascene structure on the semiconductor wafer to solve the above mentioned problems.

In a preferred embodiment, the present invention provides a method of forming a dual damascene structure on a semiconductor wafer, the semiconductor wafer comprising a substrate, a conductive layer positioned on a predetermined area of the substrate, a first dielectric layer horizontally covered on the substrate and the conductive layer, a second dielectric layer positioned on the first dielectric layer, a third dielectric layer positioned on the second dielectric layer, and a first photoresist layer positioned on the third dielectric layer comprising an opening positioned above the conductive layer which extends down to the third dielectric layer, the method comprising:

performing a first dry-etching process along the opening of the first photoresist layer to vertically remove the third dielectric layer positioned under the opening down to the second dielectric layer which forms a first hole at the third dielectric layer;

removing the first photoresist layer completely;

performing a wet-etching process to remove the second dielectric layer positioned under the first hole down to the first dielectric layer which forms second hole at the second dielectric layer, the diameter of the second hole being larger than that of the first hole; and performing a lithographic process to deposit a second photoresist layer on the third dielectric layer, the second photoresist layer comprising a line-shaped opening positioned above the first and second holes, the width of the line-shaped opening being larger than the diameter of the first hole and the diameter of the second hole;

performing a second dry-etching process to vertically remove the third dielectric layer positioned under the line-shaped opening down to the second dielectric layer so as to form a line-shaped recess, and also to vertically remove the first dielectric layer under the first and second holes down to the substrate of the semiconductor wafer so as to form a step-shaped third hole between the second and first dielectric layers;

removing the second photoresist layer completely;

forming a metallic layer on the semiconductor wafer to fill the line-shaped recess and the third hole so as to form a conductive wire in the line-shaped recess and a via plug in the third hole, the conductive wire coupled with the via plug being defined as a dual damascene structure; and performing a chemical mechanical polish (CMP) process to remove the metallic layer positioned on the third dielectric layer and to align the upper surface of the conductive wire with the surface of the third dielectric layer.

It is an advantage of the present invention that the method for forming a dual damascene structure can prevent voids forming in the via plug of the dual damascene structure.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 7:
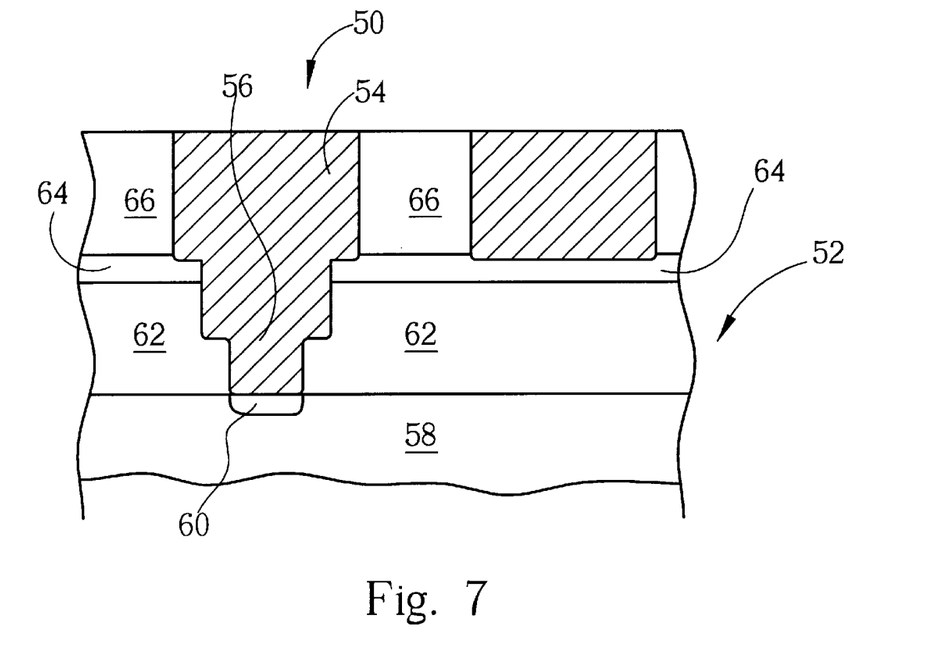
FIG. 7 is a schematic diagram of a dual damascene structure formed on a semiconductor wafer according to the present invention method.

Please refer to FIG. 7. FIG. 7 is a schematic diagram of a dual damascene structure 50 formed on a semiconductor wafer 52 according to the present invention. The present invention provides a method of forming a dual damascene structure 50 on a semiconductor wafer 52. The dual damascene structure 50 comprises a conductive wire 54 coupled with a via plug 56. The semiconductor wafer 52 comprises a substrate 58, a conductive layer 60 positioned on a predetermined area of the substrate 52, an ILD 62 formed of silicon oxide horizontally covering the substrate 58 and the conductive layer 60, a silicon nitride layer 64 covering the ILD 62, and an ILD 66 formed of silicon oxide covering the silicon nitride layer 64. The silicon oxide in the ILD 62 and ILD 66 is formed by depositing phosphosilicate glass (PSG) with a thickness of about 4000~8000 angstroms. The silicon nitride layer 64 is also used as an ILD layer and is formed by a PECVD process or a low pressure chemical vapor deposition (LPCVD) process with a thickness of about 200~1500 angstroms.

Figure 8:
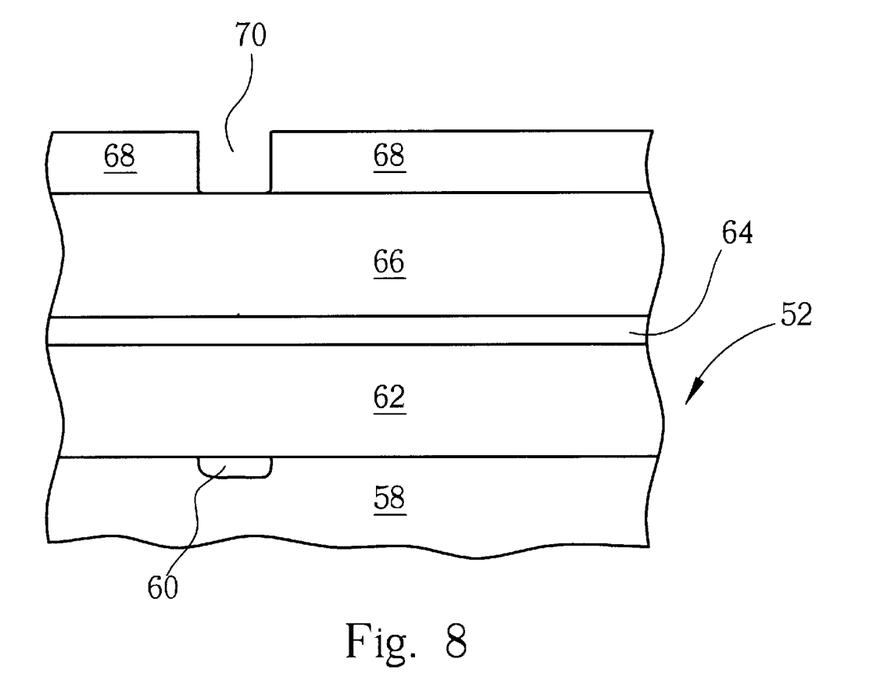
FIG. 8 to FIG. 13 are schematic diagrams of the process of forming the dual damascene structure on the semiconductor wafer according to the present invention.

Please refer to FIG. 8 to FIG. 13. FIG. 8 to FIG. 13 are schematic diagrams of the process of forming the dual damascene structure 50 on the semiconductor wafer 52 according to the present invention. As shown in FIG. 8, the semiconductor wafer 52 comprises three dielectric layers: the ILD 62, the silicon nitride layer 64 and the ILD 66. Before forming the dual damascene structure 50, a lithographic process is performed to form a first photoresist layer 68 evenly on the ILD 66, and the photoresist layer 68 comprises an opening 70 positioned above the conductive layer 60 extending down to the ILD 66. The opening 70 is used to define the pattern of the via plug 56.

Figure 9:
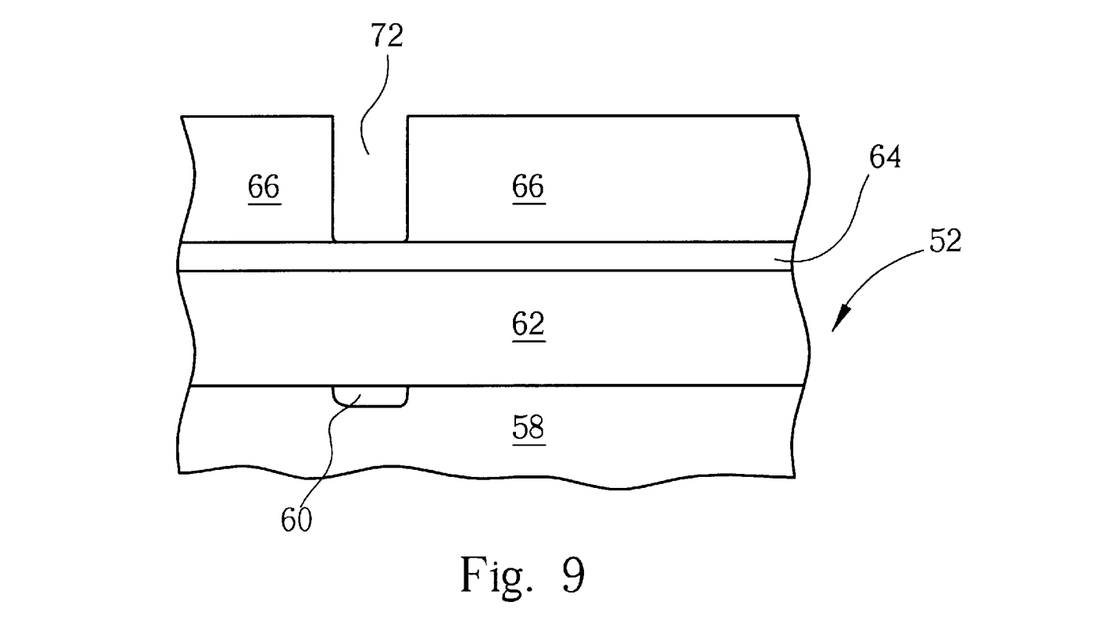

As shown in FIG. 9, when the present invention method of forming the dual damascene structure 50 is performed on the semiconductor wafer 52, a first dry-etching process is performed along the opening 70 to vertically remove the ILD 66 under the opening 70 down to the silicon nitride layer 64, which is used as a stop layer, so as to form a hole 72 in the ILD 66. Then the photoresist layer 68 is removed completely.

Figure 10:
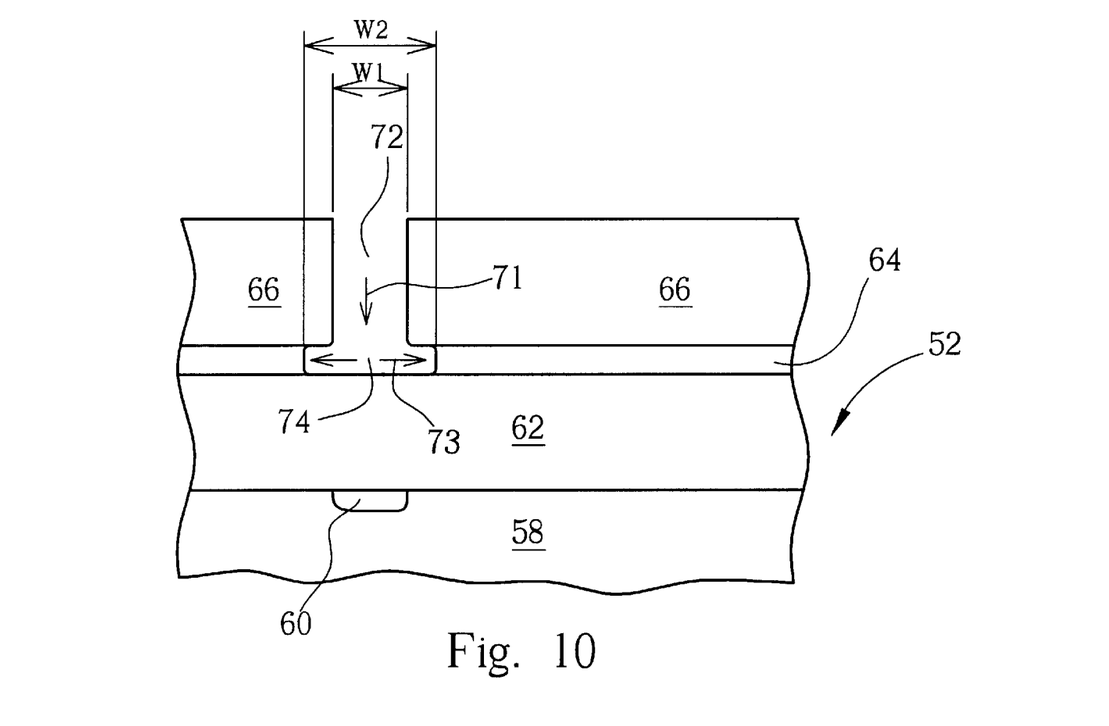

As shown in FIG. 10, after the photoresist layer 68 is removed, a wet-etching process is performed on the silicon nitride layer 64 by employing phosphoric acid ($H_3PO_4$) as the etching solution so as to remove the silicon nitride layer 64 in a specific area at the bottom of the opening 72 down to the ILD 62. The arrowheads 71, 73 in FIG. 10 show the directions that the etching process proceeds. The $H_3PO_4$ solution will not erode silicon oxide which forms ILD 66 and ILD 62, and so the silicon nitride layer 64 will not only undergo a vertical etch (the arrowhead 71), but will also undergo an isotropic horizontal etch (the arrowhead 73) during the wet-etching process. Thus, a hole 74 is formed under the hole 72 and the diameter of the hole 74 (W2) is larger than the diameter of the hole 72 (W1).

Figure 11:
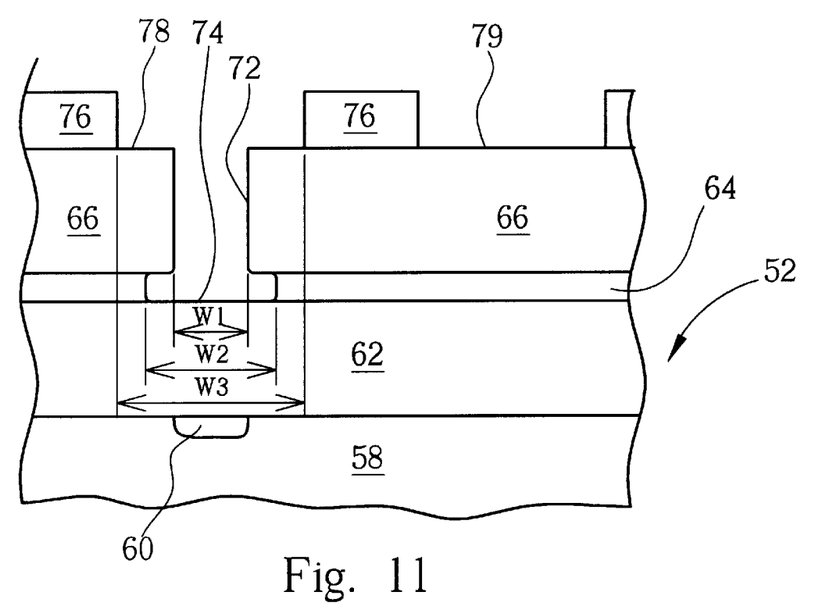

As shown in FIG. 11, a lithographic process is performed to define the pattern of the conductive wires, which are used to connect the devices. A second photoresist layer 76 is formed evenly on the ILD 66. The photoresist layer 76 comprises two line-shaped openings 78, 79. The line-shaped opening 78 is positioned above the hole 72 and the hole 74. The width of the line-shaped opening 78 (W3) is larger than the diameter of the hole 72 (W1) and than the diameter of the hole 74 (W2).

Figure 12:
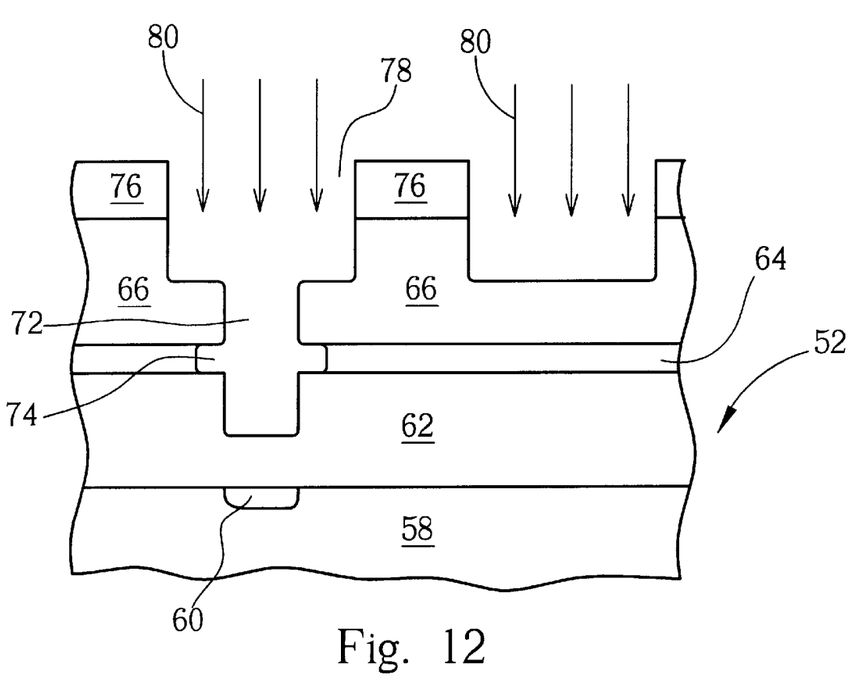
Figure 13:
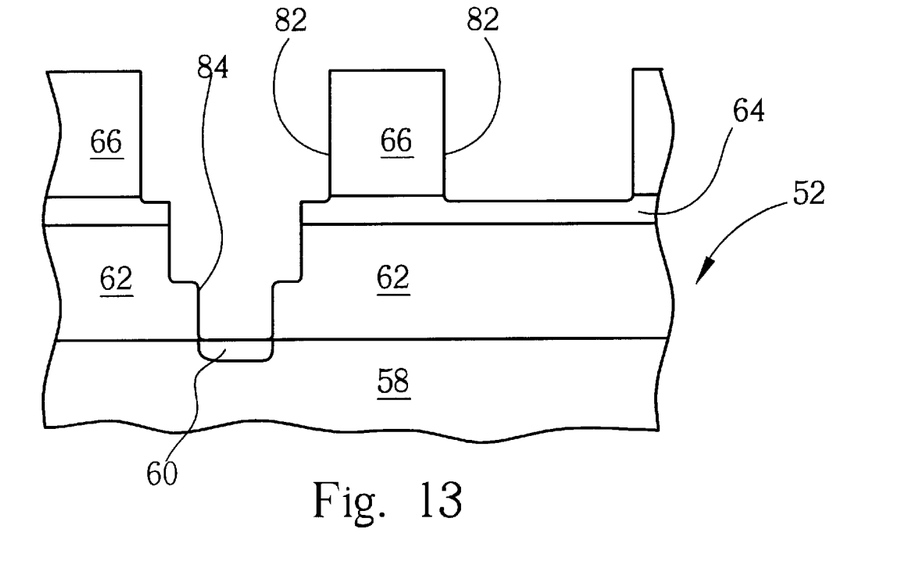

As shown in FIG. 12 and FIG. 13, after the second photoresist layer 76 is formed, a second dry-etching process is performed. The arrowheads 80, shown in FIG. 12, indicate the direction that the second dry-etching process proceeds. The second dry-etching process is performed to etch the silicon oxide in the ILD 66 and the ILD 62 by applying fluorocarbon plasma in a reactive ion etching (RIE) process. The silicon nitride layer 64 is used as a shielding-barrier layer to control the etching depth of the RIE process. The etching process is performed along the line-shaped openings 78 and 79 to vertically etch the ILD 66 down to the silicon nitride layer 64 so as to form two line-shaped recesses 82 and also along the holes 72 and 74 to vertically etch the ILD 62 down to the substrate 58 so as to form a via hole 84. Then the photoresist layer 76 is removed completely.

When the RIE process is performed along the line-shaped openings 78, 79 to vertically etch the ILD 66 down to the silicon nitride layer 64, the fluorocarbon plasma will also etch the ILD 62 through the hole 72 down to the surface of the substrate 58. Hence, when the ILD 66 under the line-shaped opening 78 is removed completely, the fluorocarbon plasma will pass through the hole 72 at the silicon nitride layer 64 and continue etching the ILD 62 so as to form a via hole 84 which has a stepped shape.

A metallic layer (not shown) is then deposited on the semiconductor wafer 52 to fill the line-shaped recesses 82 and the via hole 84. A chemical mechanical polish (CMP) process is performed to remove the metallic layer positioned on the ILD 66 and to align the upper surface of the conductive wire 54 with the surface of the ILD 66 so as to form the conductive wire 54 coupled with via plug 56 which is defined as the dual damascene structure 50, as shown in FIG. 7.

Figure 14:
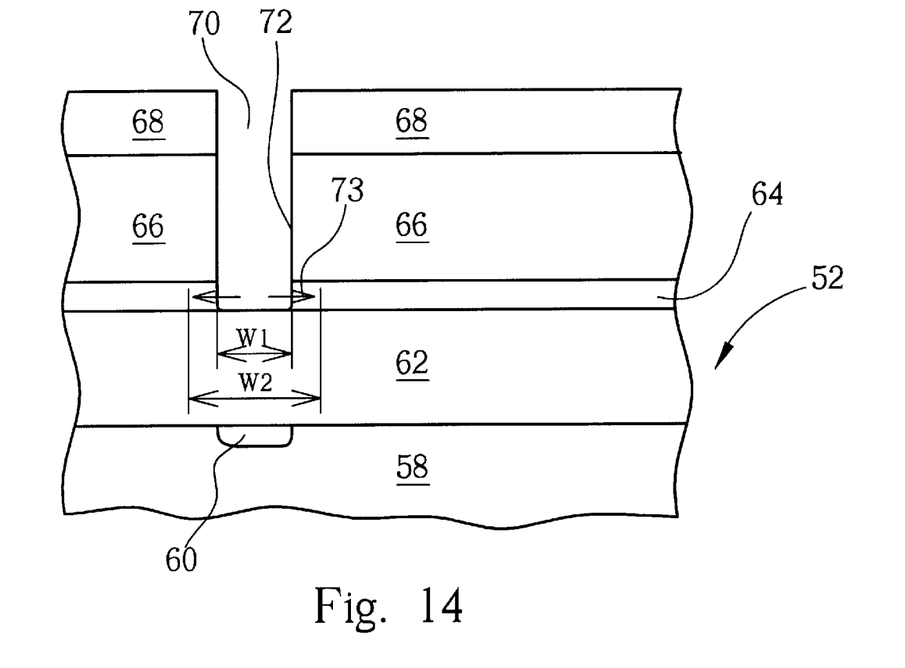
FIG. 14 is a schematic diagram of an alternative method of performing a wet-etching process on the semiconductor wafer according to the present invention.

Please refer to FIG. 8 and FIG. 14. FIG. 14 is a schematic diagram of an alternative method of forming the hole 72 on the semiconductor wafer 52 according to the present invention. When the first dry-etching process is performed, ILD 62 can also be used as the stop layer of the first dry-etching process. The process is performed to vertically remove the ILD 66 and the silicon nitride layer 64, which are not covered by the photoresist layer 68, down to the ILD 62. Then a wet-etching process is performed along the horizontal direction 73 to etch the silicon nitride layer 64 isotropically by employing $H_3PO_3$ as the etching solution. After a hole whose diameter (W3) is larger than the diameter of the hole 72 (W1) is formed, the process mentioned in the above FIG. 11 to FIG. 13 is performed to continue forming the dual damascene structure 50.

Furthermore, in the present invention method of forming the dual damascene structure 50, the ILD 62 and ILD 66 can be formed of silicon nitride, and the original silicon nitride layer 64 between the ILD 62 and ILD 66 can be replaced by a silicon oxide layer.

Hence, the semiconductor wafer comprises the two silicon nitride layers which are ILD 62 and ILD 66 and a silicon oxide layer which is the ILD 64 between the ILD 62 and ILD 66. When the wet-etching process is performed, the phosphoric acid should be replaced by other chemical solutions which can etch silicon oxide, such as hydrofluoric acid (HF) or buffered oxide etcher (BOE). Also, the plasma in the RIE process should be replaced by nitrogen trifluoride ($NF_3$) plasma to etch the silicon nitride. Because the nitrogen trifluoride plasma in the second dry-etching process has higher selectivity to silicon nitride, the ILD formed by silicon oxide will not be etched. Consequently, it is only necessary to adjust the etching solutions or etching gases to different materials so that the same process can also be performed on the semiconductor wafer 52 with the ILD 62 and 66 formed of silicon nitride and the silicon oxide layer between the ILD 62 and ILD 66 to form the dual damascene structure 50.

The characteristic of the present invention method of forming the dual damascene structure 50 on the semiconductor wafer 52 is to provide one more wet-etching process between the two dry-etching processes on ILD 66 and ILD 62 so as to form the hole 74 at the silicon nitride layer 64 whose diameter is larger than the diameter of the hole 72 at the ILD 66. The silicon nitride layer 64 is used as a shielding-barrier layer in the RIE process to form the via hole 84 with a stepped shape in the ILD 62. The structure of the via hole 84, whose top portion is wider than its bottom portion, reduces its high aspect ratio so that the metallic layer can fill the hole 84 without voids. The resistance of the via plug 56 is reduced and the electrical performance of the dual damascene structure is enhanced, improving the yield of the process.

In contrast to the prior art method of forming the dual damascene structure on the semiconductor wafer, the present invention provides one more wet-etching process between the two dry-etching processes to form a hole 74 with a larger diameter and a via hole 84 with a wide top and a narrow bottom, and further to reduce the high aspect ratio of the via hole 84 so as to form a good dual damascene structure with no voids inside it.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a dual damascene structure on a semiconductor wafer, the semiconductor wafer comprising a substrate, a conductive layer positioned on a predetermined area of the substrate, a first dielectric layer horizontally covered on the substrate and the conductive layer, a second dielectric layer positioned on the first dielectric layer, a third dielectric layer positioned on the second dielectric layer, and a first photoresist layer positioned on the third dielectric layer comprising an opening positioned above the conductive layer and extended down to the third dielectric layer, the method comprising:

performing a first dry-etching process along the opening of the first photoresist layer to vertically remove the third dielectric layer positioned under the opening down to the second dielectric layer which forms a first hole at the third dielectric layer;

removing the first photoresist layer completely;

performing a wet-etching process to remove the second dielectric layer positioned under the first hole down to the first dielectric layer which forms a second hole at the second dielectric layer, the diameter of the second hole being larger than the diameter of the first hole; and performing a lithographic process to form a second photoresist layer on the third dielectric layer, the second photoresist layer comprising a line-shaped opening positioned above the first and second holes, the width of the line-shaped opening being larger than the diameter of the first hole and the diameter of the second hole;

performing a second dry-etching process to vertically remove the third dielectric layer positioned under the line-shaped opening down to the second dielectric layer so as to form a line-shaped recess, and also vertically removing the first dielectric layer under the first and second holes down to the substrate of the semiconductor wafer so as to form a step-shaped third hole at the second and first dielectric layers;

removing the second photoresist layer completely;

forming a metallic layer on the semiconductor wafer to fill the line-shaped recess and the third hole so as to form a conductive wire in the line-shaped recess and a via plug in the step-shaped third hole, the conductive wire coupled with the via plug being defined as a dual damascene structure; and performing a chemical mechanical polish (CMP) process to remove the metallic layer positioned on the third dielectric layer and to align the upper surface of the conductive wire with the surface of the third dielectric layer.

2. The method of claim 1 wherein the first dielectric layer and the third dielectric layer are formed by silicon oxide with a thickness of about 4000~8000 (angstrom, Å), respectively.

3. The method of claim 2 wherein the silicon oxide is formed by depositing phosphosilicate glass (PSG) using a plasma-enhanced chemical vapor deposition (PECVD) process.

4. The method of claim 2 wherein the second dielectric layer is formed by silicon nitride (SiN) with a thickness about 200~1500 Å which is used as a stop layer during the first dry-etching process and a shielding-barrier layer during the second dry-etching process.

5. The method of claim 1 wherein the wet-etching process employs phosphoric acid as the etching solution.

6. The method of claim 1 wherein the second dry-etching process is a reactive ion etching (RIE) process.

7. The method of claim 1 wherein the first dielectric layer and the third dielectric layer are formed of silicon nitride.

8. The method of claim 7 wherein the second dielectric layer is formed of silicon oxide which is used as a stop layer during the first dry-etching process and a shielding-barrier layer during the second dry-etching process.

9. The method of claim 8 wherein the wet-etching process employs hydrofluoric acid (HF) as the etching solution.

10. The method of claim 8 wherein the wet-etching process employs buffered oxide etcher (BOE) as the etching solution.

* * * * *